United States Patent [19]

Testone

[11] 3,968,405

[45] July 6, 1976

[54] STATIC ELECTRICITY SUPPRESSOR WITH PATTERNED COATING AND METHOD OF MAKING

[76] Inventor: Anthony Q. Testone, P.O. Box 414, Lee, Mass. 01238

[22] Filed: Apr. 14, 1975

[21] Appl. No.: 568,107

[52] U.S. Cl. .................................. 317/2 F; 317/4
[51] Int. Cl.² .......................................... H05F 3/00
[58] Field of Search ............. 317/2 R, 2 D, 2 A, 2 E, 317/2 F, 4; 313/309

[56] References Cited
UNITED STATES PATENTS

| | | | |
|---|---|---|---|
| 3,369,152 | 2/1968 | Spengler | 317/2 F |
| 3,671,798 | 6/1972 | Lees | 313/309 X |

*Primary Examiner*—R. N. Envall, Jr.
*Attorney, Agent, or Firm*—Irvin A. Lavine

[57] ABSTRACT

A static electricity suppressor includes a base insulating sheet having conductive patterns coated on its two surfaces, and ion emitters in the form of pointed wires passing through the sheet, the ionizing points of the emitter extending beyond one surface of the base and being spaced from the pattern thereof, which is grounded. The opposite ends of the emitters are coupled to the pattern on the second surface of the base, capacitively or directly, which second surface pattern is connected to electrical source(s). A method of making a static electricity suppressor comprises providing electrically conductive pattern coatings on opposite surfaces of a base sheet of insulating material and causing emitters, which include ionizing points, to extend transversely through the base sheet with the ionizing points beyond the adjacent base sheet surface and spaced from the pattern on that surface, the opposite ends of the emitters engaging the pattern on the opposite surface, which is in registry with the removed portion of the coating on the first surface.

12 Claims, 9 Drawing Figures

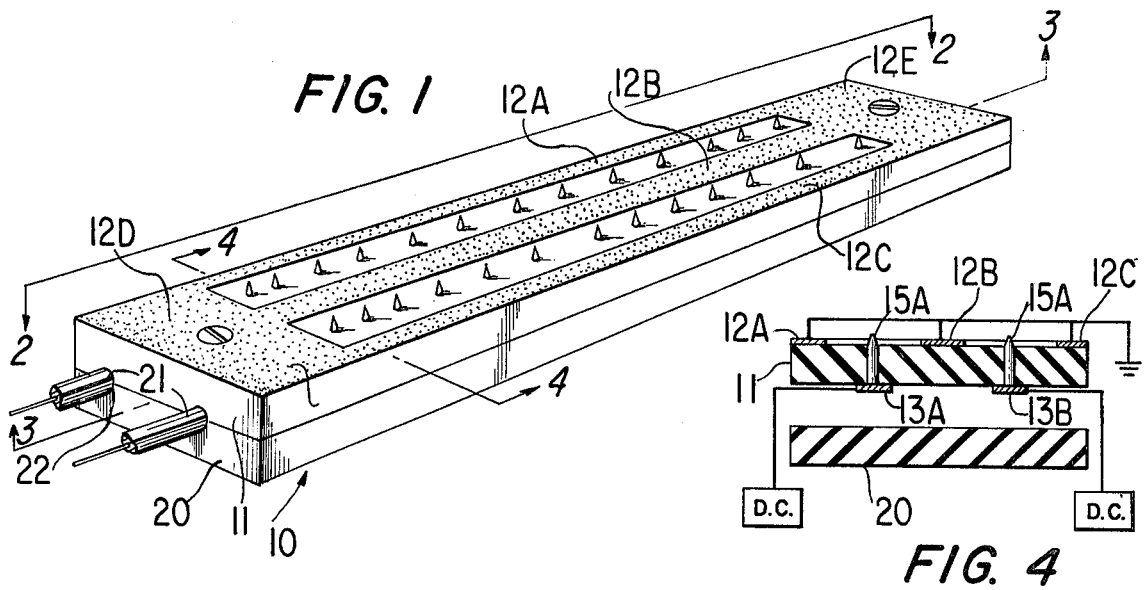
FIG. 1
FIG. 4
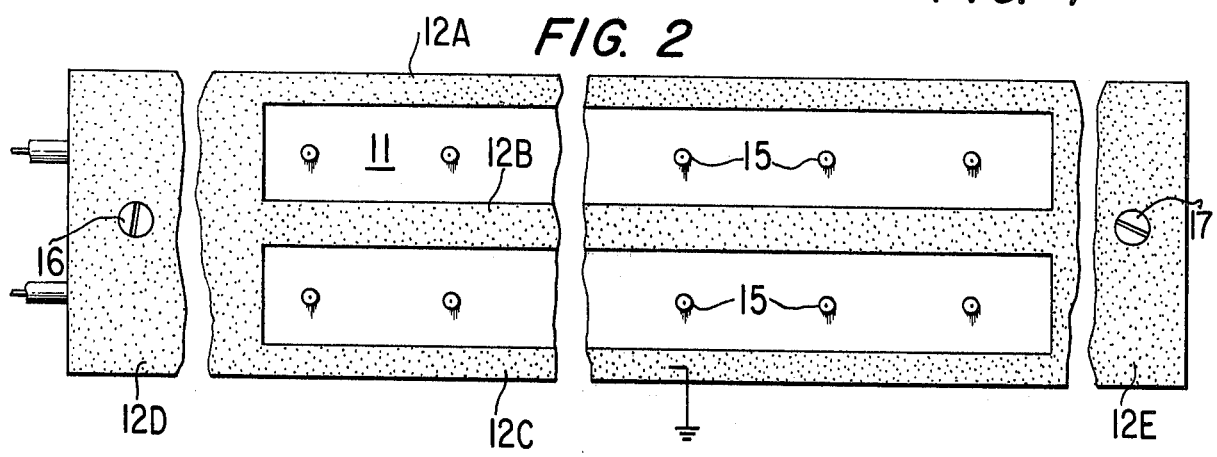
FIG. 2
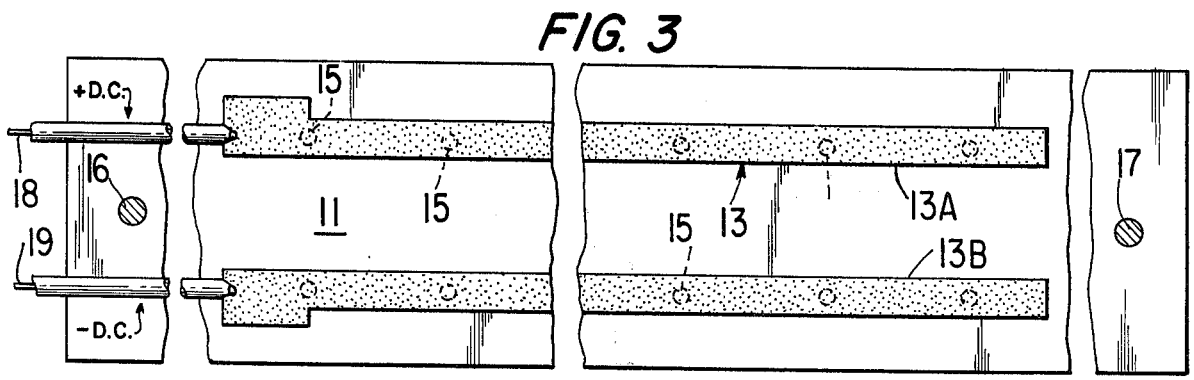
FIG. 3
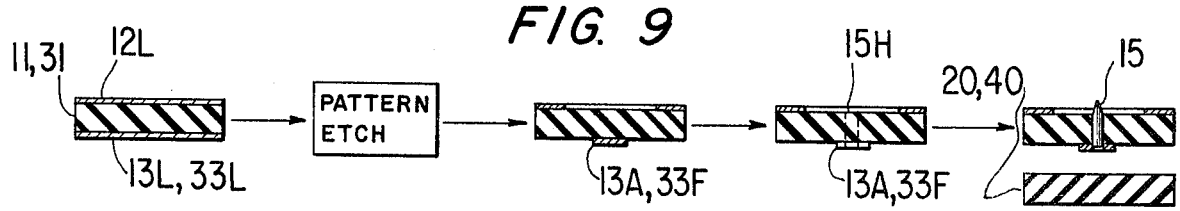
FIG. 9

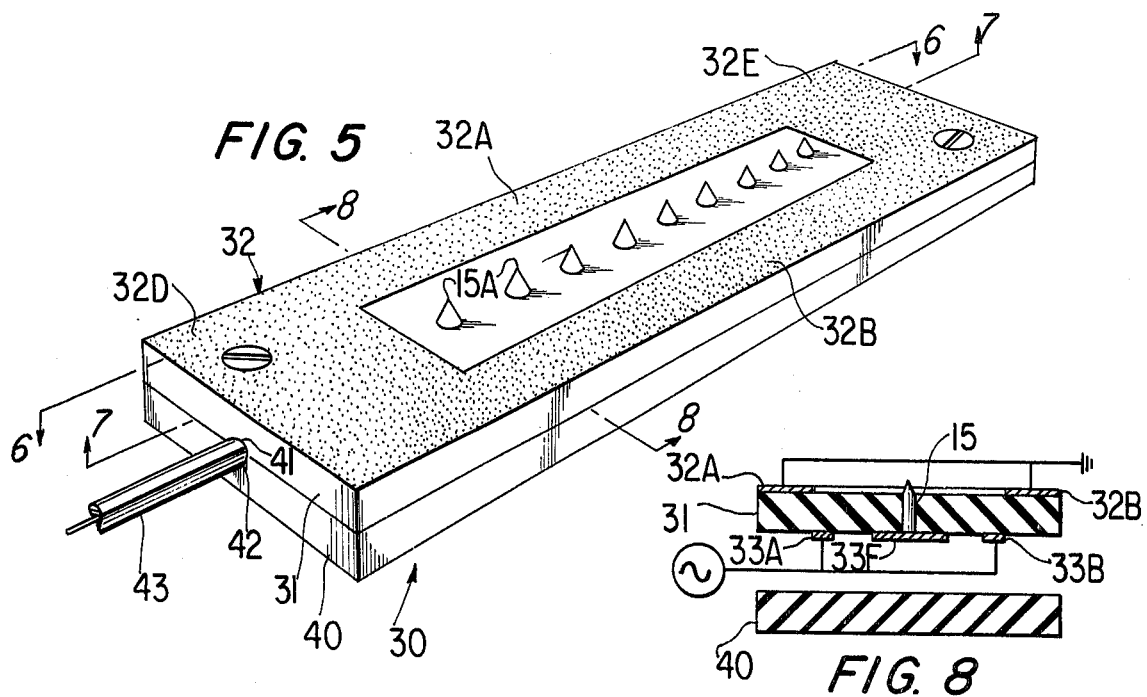
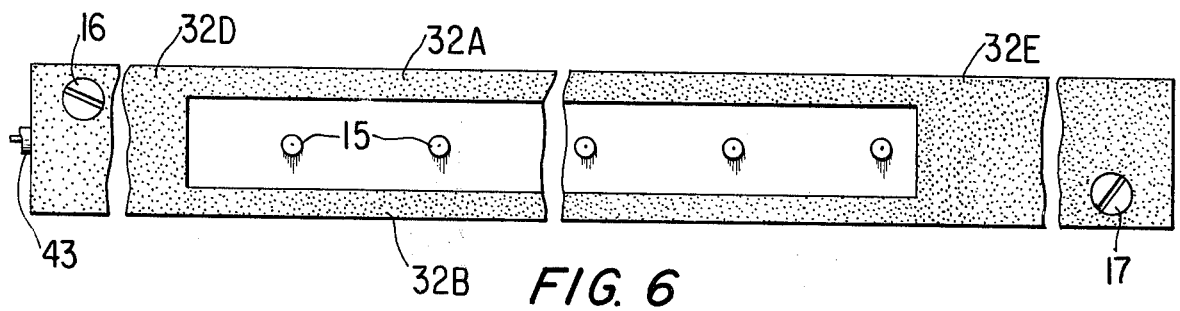
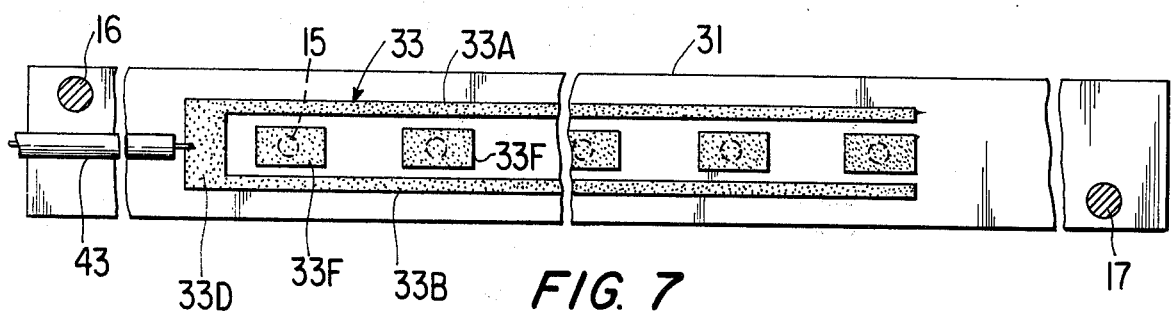

STATIC ELECTRICITY SUPPRESSOR WITH PATTERNED COATING AND METHOD OF MAKING

BACKGROUND OF THE INVENTION

The present invention is directed to a static electricity suppressor, and method of making it, the static electricity suppressor being a device for emitting ions in order to eliminate or suppress static electricity in such equipment as paper machinery, textile machinery and the like.

Devices for eliminating or suppressing static electricity have long been known and widely used. For many years, such devices were made of cylindrical and tubular elements, there being typically provided a cylindrical inner conductor to which electrical energy was supplied, with a plurality of needle-like emitters joined to and/or piercing the cylindrical conductor, the emitters having their free ends in the form of points, which points were located on a common line. It was known, also to provide an encircling shield of conductive material, which was grounded, there being a transverse aperture in the shield in surrounding relationship to each of the points of each emitter. Such devices were generally known as so-called "hot bars" because they were of linear form, and because the electric potential was applied directly to the central conductor and the needle-like emitters. There was also known a so-called "shock proof" bar in which the emitters were capacitively coupled to the main supply conductor: in one embodiment, the central main conductor was ordinary insulated wire, the wire having a plurality of spaced conductive rings on it, with a needle-like emitter in direct contact with each of the conductive rings.

Later there were developed other bars in which the surrounding conductive tube was eliminated, there being used instead a channel-shaped member, which in some embodiments was used as the grounded member, while in other embodiments it was used as an electricity buss bar. While the devices, through continuous development, resulted in somewhat reduced cost, they have not achieved as low a cost as is desirable.

Further and more recent developments have been away from the above noted constructions. For example, a known static neutralizer is formed of a pair of rectangular bar sections in face-to-face contact. One of these sections was provided with fine grooves which, when the two sections were engaged, provided passages for discharge elements formed of fine resilient wire stock. A half-channel was provided in each of the rectangular sections, in which the current supply wire was located, being provided with a plurality of spaced conductive induction sleeves, each of which was engaged by a discharge element. Such construction requires threading of the induction sleeves on the wires, the provision of thin grooves, and the assemblage of fine wires in the grooves, all of which lead to an expensive construction: also, there were provided adjacent the free ends of the discharge elements grooves in the outer surfaces of the pair of bar sections, in which was positioned a ground wire. The construction was expensive because it required, in addition to the threading operations, other expensive manufacturing operations of fairly close tolerance.

Another proposal in the prior art provided an elongate base of insulating material on a side of which was a conductive discharge element of thin, flat, elongate shape having one straight edge and the opposite edge provided with a plurality of sharp emitter points, between which were smooth semi-circular areas. On the opposite side of the elongate base was a conductive ground element of thin, elongate shape. This structure was mounted in a generally U-shaped insulating housing. It was a hot bar, in that the discharge element was directly connected to a source of electricity.

Another proposal in the prior art provided an elongate laminated structure including a base strip of insulating material provided on one side with a continuous conductive strip connected to a source of electricity and on the opposite side with a plurality of ionizing elements each in the form of a generally square plate with an ionizing tip extending from it. In this construction, which was of the "shock proof" type, there was no provision for a ground.

Also known to the prior art was an electro-static charging or discharging device comprising a body of insulating material having grooves on one of its surfaces; at each end of the grooves were bores extending through the insulating material body. In these bores were inserted needles, and the body was provided with a metal element for common connection to the two rows of needles. This device, while utilizing needle-like emitters, required a number of manufacturing steps, to provide the noted grooves, or required a mold of substantial complexity, if it were to be formed by molding. Further, this device had no provision for a ground.

SUMMARY OF THE INVENTION

The present invention provides a static electricity suppressor or eliminator including a base of insulating material in the form of a flat plate or sheet. The insulating plate is coated on its two opposite surfaces with conductive coatings of very thin material, which may have been initially adhered to the entire surfaces of the insulating sheet, and then removed, in pattern form, as by etching. Pointed wires form emitters, and extend transversely through the insulating sheet. Preferably, the emitter wires are arranged in one or more linearly extending rows, with their emitter points extending beyond one surface of the insulating sheet. The patterned coating is in spaced relation to the ends of the wires, due to the absence of the coating from that portion of the insulating sheet surface in proximity to the emitter points of the emitter wires. The conductive pattern coating which remains on the noted surface is connected to ground. The opposite ends of the emitter wires are coupled to the conductive coating pattern on the opposite surface of the insulating material sheet. In a first embodiment of the invention, the emitter wires are arranged in two linearly extending rows, and the ends of the emitter wires opposite the points are directly connected to a conductive coating pattern in strip form. Each strip is connected to a direct current source, one of which is positive and the other of which is negative. In another embodiment of the invention static electricity suppressor, each of the emitter wire input ends is directly in engagement with an isolated portion of the conductive coating, there being an adjacent portion of the conductive coating in spaced relation to it, so as to provide capacitive coupling when the spaced portion of the coating is connected to a source, such as of alternating current. In both embodiments, the emitter input ends are directly connected to a portion of the conductive pattern coating, which may be either directly coupled or capacitively coupled to source.

A method is provided for making such static electricity suppressors which includes providing a plate of electrically insulating material and coating it on opposite sides with a thin layer of electrically conductive material. A portion of each of the layers is removed, with the removal of the portion on one side being such as to leave an intact portion which is in alignment with a part of the other side which has been removed. Emitter wires are passed transversely through the plate, and engage the intact portion(s) only, their opposite ends being in the form of ionizing points and extending beyond the opposite surface, and out of contact with any conductive coating thereon.

Among the objects of the present invention are to provide a static electricity suppressor which is of low cost, being made of conventional materials, and known processing steps. A further object of the present invention is the provision of a static electricity suppressor which eliminates needs for cables, other than lead-in cables or wires, and thereby the elimination of threading of elements on such wires or cables, as well as the elimination of piercing such wires or cables by needle-like discharge elements.

Yet another object of the present invention is to provide a static electricity suppressor having accurately controlled spacing of ionizing points from a grounded conductor, for the accurate control of the ion discharge path or field. Yet another object of the present invention is the provision of a static electricity suppressor in which it is possible to provide accurate control of the capacitor coupling between the emitter and the input.

A still further object of the present invention is to provide an inexpensive method for manufacturing a static electricity suppressor.

Other objects and many of the attendant advantages of the present invention will be readily understood from the following specification and drawings.

BRIEF DESCRIPTION OF THE DRAWINGS

FIG. 1 is a perspective view of a first embodiment of a static electricity suppressor in accordance with the present invention.

FIG. 2 is a plan view thereof, taken in the direction of the arrows 2—2 of FIG. 1.

FIG. 3 is a cross sectional view taken on the line 3—3 of FIG. 1.

FIG. 4 is an exploded cross sectional view taken on the line 4—4 of FIG. 1.

FIG. 5 is a perspective view of a second, capacitively coupled, embodiment of the present invention.

FIG. 6 is a plan view thereof taken on the line 6—6 of FIG. 5.

FIG. 7 is a cross sectional view taken on the line 7—7 of FIG. 5.

FIG. 8 is an exploded cross sectional view taken on the line 8—8 of FIG. 5.

FIG. 9 is a view illustrating the present inventive method.

DESCRIPTION OF THE PREFERRED EMBODIMENTS

Referring now to the drawings, wherein like or corresponding reference numerals are used for like or corresponding parts throughout the several views, there is shown in FIG. 1 a static electricity suppressor 10 in accordance with the present invention, and comprising a base sheet 11 of generally rectangular configuration, on the top surface of which is a coated conductive pattern 12, including three parallel and longitudinally extending spaced apart strips 12A, 12B and 12C. These strips are connected at their ends by the areas 12D and 12E. The coating 12 is very thin, having been applied to the insulating base sheet 11 in a known manner.

Referring to FIG. 2, there may be seen the conductive strips 12A, 12B and 12C, there being an area between the strips 12A and 12B which is bare of coating, and similarly there is an area between the strips 12B and 12C which is bare of coating. Extending into these two bare areas are two rows of emitters 15, which are of conductive wire, are needle-like, and which have ionizing points 15A (FIG. 4) which extend above the upper surface of the insulating plate or sheet 11. The emitters 15 extend transversely through the sheet or plate 11, as do a pair of screws 16 and 17.

As shown in FIG. 3, the lower surface of the insulating base sheet 11 is provided with a pattern coating of conductive material, designated 13, and including a pair of linearly extending strips 13A and 13B, each of which is directly coupled to the bases or input ends of the emitters 15. The strips 13A and 13B are opposite to and in registry with the bare portions between the strips 12A, 12B and 12C. This is clearly shown, also, in FIG. 4. The ends of the strips 13A and 13B may be somewhat enlarged, for connection 4 to lead-in wires 18 connected to a positive DC source and 19 connected to a negative DC source, respectively.

As shown in FIG. 1, a cover sheet 20 is provided to protect the pattern 13 on the bottom of base sheet 11, having substantially the same dimensions as the base sheet 11. These sheets are provided with semi-cylindrical channels 21 and 22, respectively, for receiving the two lead-in wires 18 and 19, which latter are bared of insulation at their ends and suitably connected to the strips 13A and 13B. The screws 16 and 17 serve to hold the sheets 11 and 20 in assembled relationship, and may also be used for securing the entire static electricity suppressor in position, as to a suitable conductive member which is connected to ground: alternatively, a ground connection for the conductive coating 12 may be otherwise provided.

The above described construction may be made of any desired suitable dimensions. For example, the sheets or plates 11 and 20 may be each ⅛ inch thick, one inch wide and 15 inches long, and the effective length of the static eliminator 10 may then be 12 inches. The insulating sheets with conductive coating are readily obtained and/or fabricated, and the dimension and positioning of the respective bare areas and remaining intact areas of the conductive coatings is readily achieved, with suitable precision.

Another embodiment of the present invention is shown in FIGS. 5–8, this embodiment providing for capacitive coupling, rather than direct coupling of the emitters to source(s) as was the case in connection with the first embodiment. As shown in FIG. 5, the shockless static eliminator 30 includes an insulating base sheet or plate 31 on the upper surface of which is a patterned coating 32 which includes a pair of spaced parallel strips 32A and 32B, with a bare space between them, these strips being joined at their ends by the areas 32D and 32E. Ionizing points 15A of emitters 15 may be seen extending beyond the upper surface of the base sheet 31, the points 15A preferably being in line with each other. FIG. 6 shows, also, the conductive pattern 32 including the strips 32A and 32B and the areas 32D and 32E, with the bare space therebetween into which the emitters 15 extend. Also shown are screws 16 and 17, shown off-center, and used for the same purposes as in the first embodiment.

FIG. 7 shows the bottom of the base sheet 31, with a conductive pattern 33 thereon for capacitively coupling the needle-like wire emitters 15 to a source. Thus, the conductive coating 33 includes first and second linearly extending spaced and parallel strips 33A and 33B, joined at one end by the areas 33D. In addition, the coating 33 includes a plurality of separate isolated conductive elements 33F, each of which is directly coupled to the base or input end of an emitter 15. The distance between the isolated elements 33F and the strips 33A and 33B (see also FIG. 8) is selected to provide a capacitance of $5 \times 10^{-1}$ pico farads, the operating voltage connected to the area 33D being 6000 to 8000 volts, RMS.

The static electricity suppressor 30 comprises a bottom sheet or cover plate 40, which may be connected to the base sheet 31 by the screws 16 and 17, and which may have a semi-cylindrical channel 42 in opposing relationship to a semi-cylindrical channel 41 in the base sheet 31. These two channels receive a lead-in insulated conductor wire 43, the conductive part of which is suitably connected to the area 33D of conductive pattern 33.

The ionizing points 15A and the strips 12A, 12B, 12C in the embodiment of FIGS. 1–4, and the ionizing points 15A and the patterned coating 32 in the embodiment of FIGS. 5–8, are exposed to atmosphere in order to ionize air molecules in the manner described in Testone, U.S. Pat. No. 3,643,128 and Testone, U.S. Pat. No. 3,746,924.

The embodiments of the apparatus invention as described above and shown in the drawings are exemplary only, as the invention may be practiced by other specific constructions. By way of example, instead of two rows of emitters, as shown in FIGS. 1–4, there may be only a single row, connected to an appropriate source. Further, the emitters need not be arranged in a row or straight line: for example, they may be provided around the periphery of an insulative material bench or table, having the entire center provided with a grounded, conductive coating, to provide a work station for parts assembly free of static charges.

There is shown in FIG. 9 a method of making the static compressors as shown in FIGS. 1–8. There is first provided a plate or sheet of electrically insulating material, 11, 31, having on the opposite surfaces thereof thin layers 12L, 32L and 13L, 33L of electrically conductive material. Such electrically conductive material may be electrolytically deposited, or otherwise applied to the insulating base sheet in a known manner. Next, a portion of the layer 12L, 32L is removed, as by etching, to provide a desired pattern, and a portion of the coating 13L, 32L is removed, as by etching. There is left of the coating 13L, 33L at least the intact portion 13A, 33F which is in alignment with the part of the first surface from which the layer 12L, 32L has been removed. Next, holes 15H are drilled through the insulating plate 11, 31, extending also through the conductive pattern portion 13A, 33F: also, holes for the screws 16, 17 may be drilled at this time. The emitters 15 are then passed through the holes, thereby engaging, also, the portions 13A, 33F. The semi-cylindrical channels may be provided by milling, or by placing two of the structures as shown in the first part of FIG. 9 in facing relationship and drilling. The current supply wire or wires are then provided in the channels, with the conductors thereof suitably connected to a portion of the pattern as hereinabove described. Finally, the cover plate or sheet of insulating material 20, 40 is provided.

There has been provided an inexpensive static electricity eliminator which may be made of conventional materials and known steps. The eliminator eliminates cables or wires, except for lead-in cables and wires, and therefore there is no necessity for either the threading of elements thereon, or the piercing of such cables or wires with needle-like emitters. The herein disclosed static electricity eliminator has accurately spaced emitters, in relation to the ground conductors, for suitably precise control of the ion discharge path or field, leading from the ionizing points of the emitters to the grounded conductor. Also, the herein disclosed static electricity suppressor may be either coupled capacitively or directly to suitable electrical sources. Further, there has been provided a method which enables the production of various kinds, such as hot and shockless, of static electricity suppressors extremely economically, while yielding suppressors of suitable operating characteristics.

It will be obvious to those skilled in the art that various changes may be made without departing from the spirit of the invention and therefore the invention is not limited to what is shown in the drawings and described in the specification but only as indicated in the appended claims.

I claim:
1. A static electricity suppressor comprising:
   a. a sheet of electrically non-conductive material,
   b. elongate electrically conductive emitter means extending transversely through said sheet, having an ionizing point outwardly of a first surface of said sheet and an opposite end adjacent a second surface of said sheet,
   c. first electrically conductive coating pattern means on said first surface of said sheet in spaced relation to said point means and being exposed to atmosphere with said point means,
   d. second electrically conductive pattern means on said second surface of said sheet electrically coupled to said point means,
   e. means for connecting said second conductive coating pattern means to electrical source means to thereby cause said emitter to emit ions into the atmosphere, and
   f. means for connecting said first conductive coating pattern means to ground to thereby provide a path to ground for ions engaging said first conductive coating pattern means.

2. The static electricity suppressor of claim 1, and further comprising a second sheet of electrically non-conductive material overlying said second electrically conductive pattern means.

3. The static electricity suppressor of claim 1, wherein said electrically conductive emitter means comprises a plurality of spaced emitters, said first electrically conductive coating pattern means substantially encompassing the ionizing points of said emitters.

4. The static electricity suppressor of claim 3, said emitters comprising a first group and a second group, said second electrically conductive pattern means comprising first and second means for independently connecting together said first and second groups of emitters respectively.

5. The static electricity suppressor of claim 4, said electrical source means comprising a positive direct current source and a negative direct current source, said means for connecting said second pattern to electrical source means comprising means connecting said positive direct current source to said first emitter connecting means and said negative direct current source to said second emitter connecting means.

6. The static electricity suppressor of claim 4, wherein said first and second emitter connecting means each comprises a linearly extending strip in electrical contact with the emitters of the first and second groups, respectively.

7. The static electricity suppressor of claim 4, wherein said first and second groups of emitters are positioned in two rows, and said first conductive pattern means comprises a strip between said rows and a pair of strips outwardly of said rows.

8. The static electricity suppressor of claim 3, wherein said second electrically conductive pattern means comprises a linearly extending strip in electrical contact with the ends of said emitters opposite the ionizing points thereof.

9. The static electricity suppressor of claim 3, wherein said second electrically conductive pattern means comprises means for capacitively coupling said emitters to electrical source means.

10. The static electricity suppressor of claim 9, wherein said second electrically conductive coating pattern comprises a separate isolated conductive element in engagement with a said emitter, and conductive strip means in spaced relation to said isolated elements, said means for connecting said second pattern means to electrical source means being connected to said conductive strip means.

11. A static electricity suppressor comprising an electrically insulating plate having a plurality of emitter wires extending transversely therethrough, said wires having points extending beyond a first surface of said plate and into atmosphere, means for supplying electricity to said emitter wires comprising a thin coating of electrically conductive material on a part of the second surface of said plate and coupled to said emitter wires, whereby to cause said emitter wire points to emit ions into atmosphere, and means in said atmosphere and spaced from said emitter wire points for conducting ions emitted thereby to earth, whereby air between said emitter wires and said last mentioned means is ionized by said emitted ions.

12. The static electricity suppressor of claim 11, wherein said last mentioned means comprises a thin coating of electrically conductive material on a part of said first surface of said plate in spaced relation to said emitter wire points.

* * * * *